United States Patent [19]
Huang et al.

[11] Patent Number: 5,993,075
[45] Date of Patent: Nov. 30, 1999

[54] VERTICAL CAVITY SURFACE-EMITTING LASER PACKAGE

[75] Inventors: Kai-Feng Huang; Kuochou Tai; San-Bao Lin, all of Hsinchu, Taiwan

[73] Assignee: Kai-Feng Huang, Taiwan

[21] Appl. No.: 08/948,353

[22] Filed: Oct. 10, 1997

[30] Foreign Application Priority Data

Jul. 15, 1997 [CN] China .................................. 86110023

[51] Int. Cl.⁶ ................................ G02B 6/36; H01S 3/18
[52] U.S. Cl. ............................... 385/92; 385/94; 385/37; 385/88; 385/49; 372/43; 372/50
[58] Field of Search ................................. 385/49, 88, 89, 385/92, 94, 37; 372/43, 50, 92, 98, 102

[56] References Cited

U.S. PATENT DOCUMENTS

| | | | |
|---|---|---|---|
| 4,790,620 | 12/1988 | Niwayama | 385/49 X |
| 4,946,242 | 8/1990 | Tanno et al. | 385/88 X |
| 5,175,783 | 12/1992 | Tatoh | 385/93 |
| 5,271,079 | 12/1993 | Levinson | 385/46 |
| 5,434,939 | 7/1995 | Matsuda | 385/88 |
| 5,647,044 | 7/1997 | Basavanhally et al. | 385/92 |

*Primary Examiner*—Brian Healy
*Attorney, Agent, or Firm*—Pillsbury Madison & Sutro LLP

[57] ABSTRACT

A vertical cavity surface-emitting laser package comprising: a first lead frame and a second lead frame, wherein the signal is inputted from the first lead frame and connected to ground through the second lead frame, and the two lead frames are approximately parallel to each other; a vertical cavity surface-emitting laser diode, disposed above the front portion of the first lead frame and connected to the front portion of the second lead frame via a bonding wire; and epoxy resin packing the space around the front portions of the first and second lead frames, the vertical cavity surface-emitting laser diode, and the bonding wire for fixing and protecting them from damages. Besides, the optical fiber can be connected to interior of the package via top surface of the epoxy resin to guide signals in or out; or grating is utilized to reflect the light emitted from the vertical cavity surface-emitting laser diode, and a light detector is utilized to receive the reflected light such that automatic power control can be performed according to the reflected light received.

14 Claims, 9 Drawing Sheets

VERTICAL CAVITY SURFACE-EMITTING LASER PACKAGE

BACKGROUND OF THE INVENTION

As for as the geometric structure of light-emitting of semiconductor lasers, they can be classified into two different categories: the edge-emitting type and the surface-emitting type. Since the edge-emitting lasers have been developed earlier, their relavant technologies are mature, and thus the lasers generally adopted in various photoelectric applications are edge-emitting type. On the other hand, since fabrication of the surface-emitting laser requires more accurate epitaxy and manufacture techniques, it was not well developed until 1989. However, there are dramatic progresses on the structure design and element performance of the surface-emitting laser in these years, and it is becoming more important in future photoelectric applications.

The surface-emitting laser is usually formed with a metal can package which takes higher costs; besides, owing to the necessity of emitting the light beam vertically, the manufacturing process is more complicated.

Therefore, the object of the invention is to provide a vertical cavity surface-emitting laser package having lower costs and easier manufacturing process.

SUMMARY OF THE INVENTION

Referring to FIG. 1, the vertical cavity surface-emitting laser package according to the invention includes:

a lead frame 1 and a lead frame 2 wherein the signal is inputted from the lead frame 1 and connected to ground via the lead frame 2, the two lead frames are approximately parallel to each other;

a vertical cavity surface-emitting laser diode 3, which is disposed above the front portion of the lead frame 1 and is connected to the front portion of the lead frame 2 by a bonding wire 4; and epoxy resin 5, which packs the space around the front portions of lead frames 1 and 2, the vertical cavity surface-emitting laser diode 3, and the bonding wire 4 to fix and protect these elements.

The detailed features and characteristics of the invention is to be described more clearly with the descriptions of the preferred embodiments in conjunction with the accompanying drawings.

DESCRIPTION OF THE PREFERRED EMBODIMENTS

Figure 1:
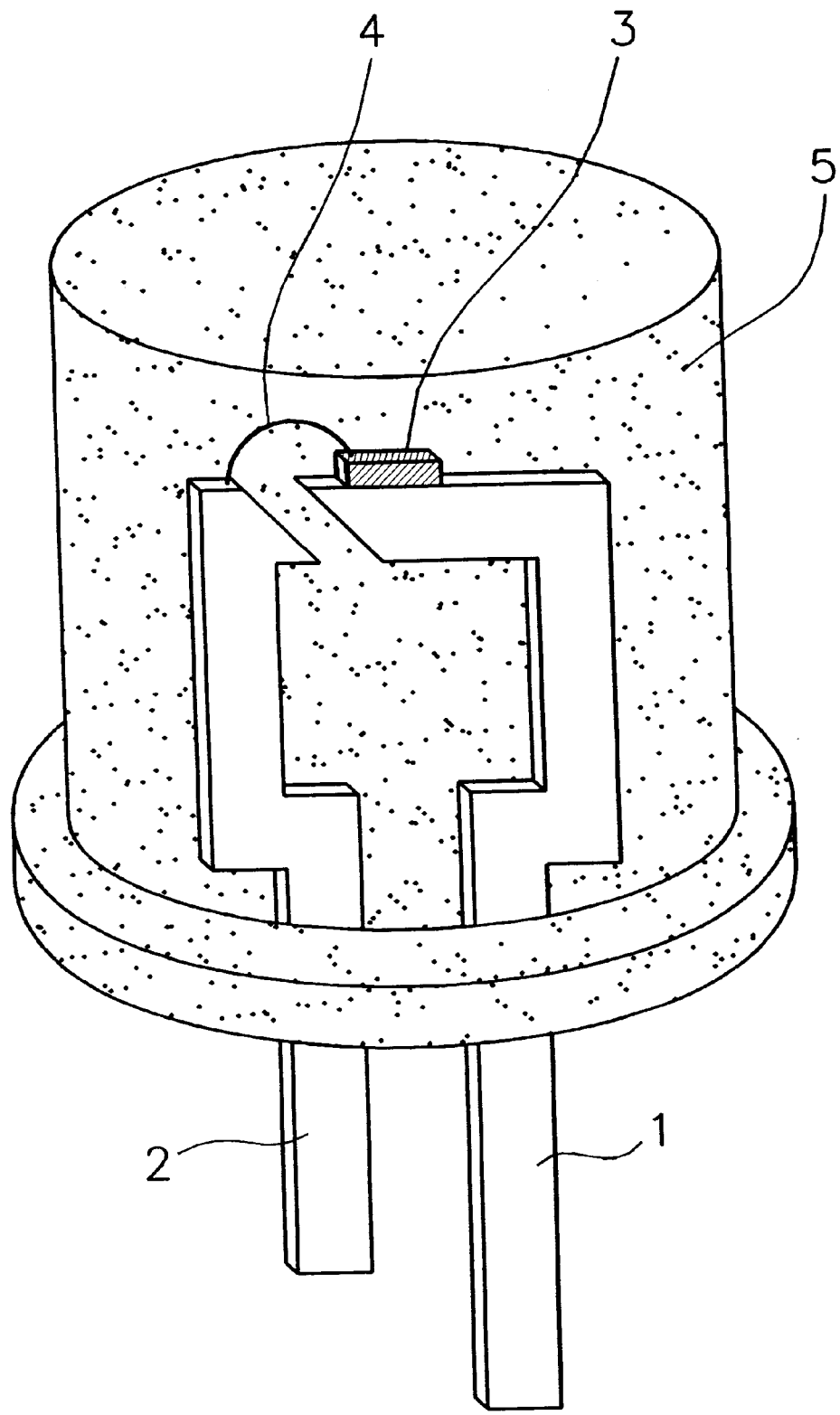
FIG. 1 shows the first conformation of the epoxy resin 5 of the first preferred embodiment according to the invention.

As can be seen from FIG. 1, the epoxy resin 5 is cylindrical, which usually is formed by mold releasing. Typically, the diameter of the cylinder is about 3~10 mm.

Figure 2:
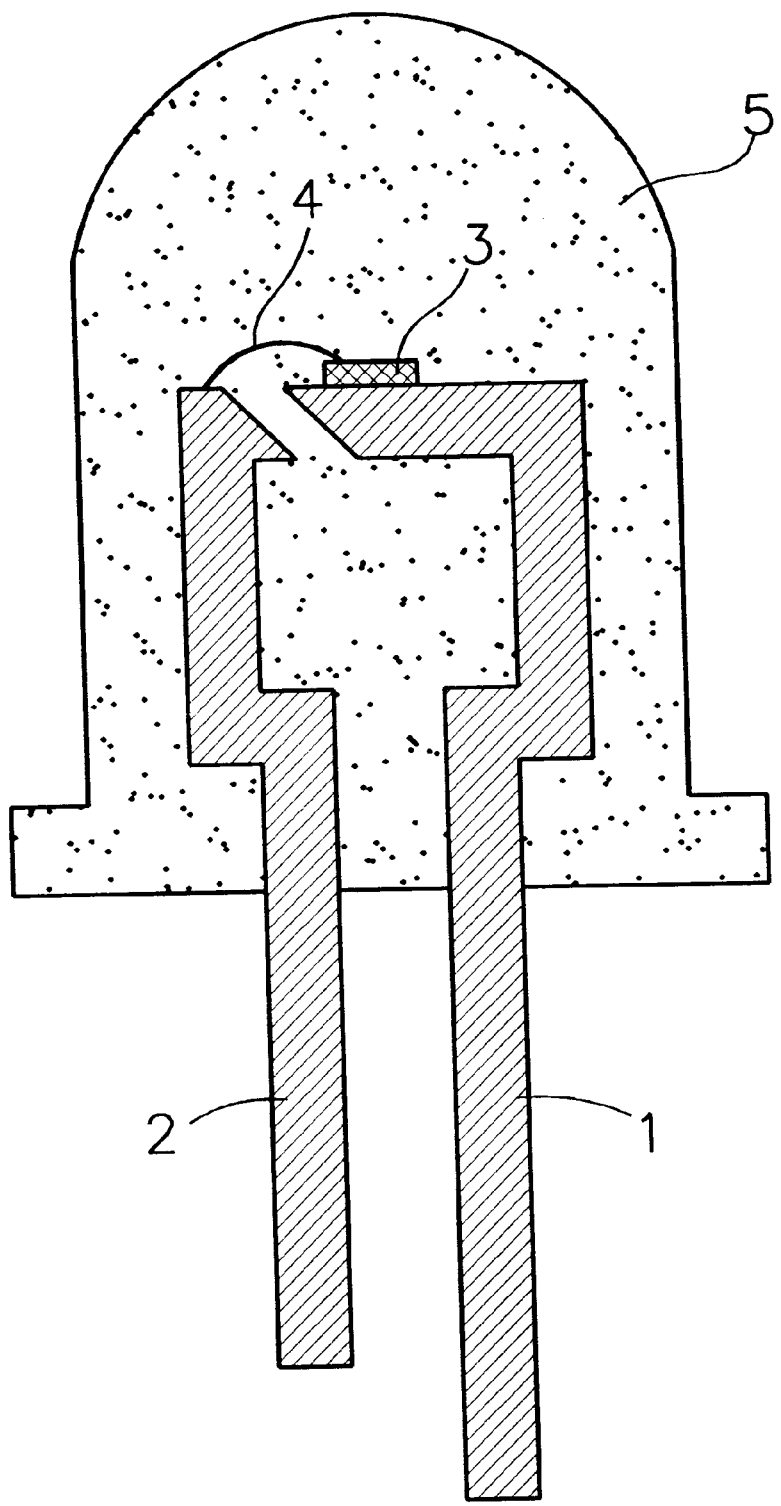
FIG. 2 shows the second conformation of the epoxy resin 5 of the first embodiment according to the invention.

In the package structure shown in FIG. 2, the shape of the epoxy resin 5 could be regarded as a concatenation of two different parts: one part is of cylindrical shape (lower part in FIG.2) and another is of tapered shape which is similar to a half ellipsoid (upper part in FIG. 2). Generally, the diameter of the cylinder is about 3~10 mm and the height of epoxy resin 5 is about 3~10 mm.

Figure 3:
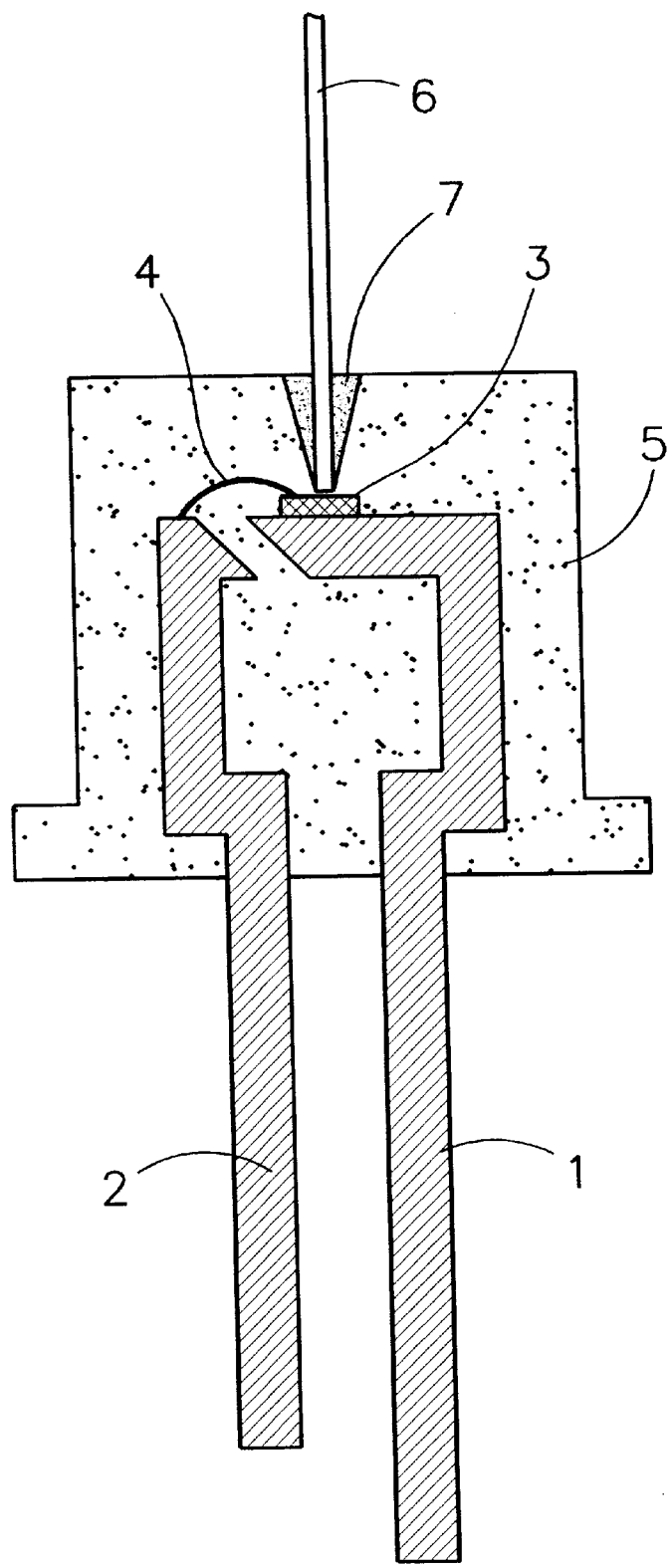
FIG. 3 is an alternative of the conformation shown in FIG. 1.

The package structure shown in FIG. 3 is similar to that of FIG. 1, with the only difference that it further comprises an optical fiber 6 protruding into the package structure from outside and connecting to the interior of the package via top surface of the epoxy resin 5. The front end of optical fiber 6 is disposed very close to the vertical cavity surface-emitting laser diode 3 such that signal can be introduced from the laser diode 3 to outside or from outside to the laser diode 3 through the optical fiber 6. To make the insertion of the optical fiber 6 easier, the crevice on top of the epoxy resin 5 in which the optical fiber 6 is inserted has a larger diameter at the top and a smaller diameter at its bottom. Generally, the top diameter is about 500~2000 $\mu$m and the bottom diameter is about 100~1000 $\mu$m. After the optical fiber 6 is inserted, the space between the epoxy resin 5 and the optical fiber 6 is filled with the epoxy resin 7 which has a refractive index matching with that of the optical fiber 6. The mechanical strength of the portion where the top of epoxy resin 5 connects to the optical fiber is further strengthened by fixing gel.

Figure 4:
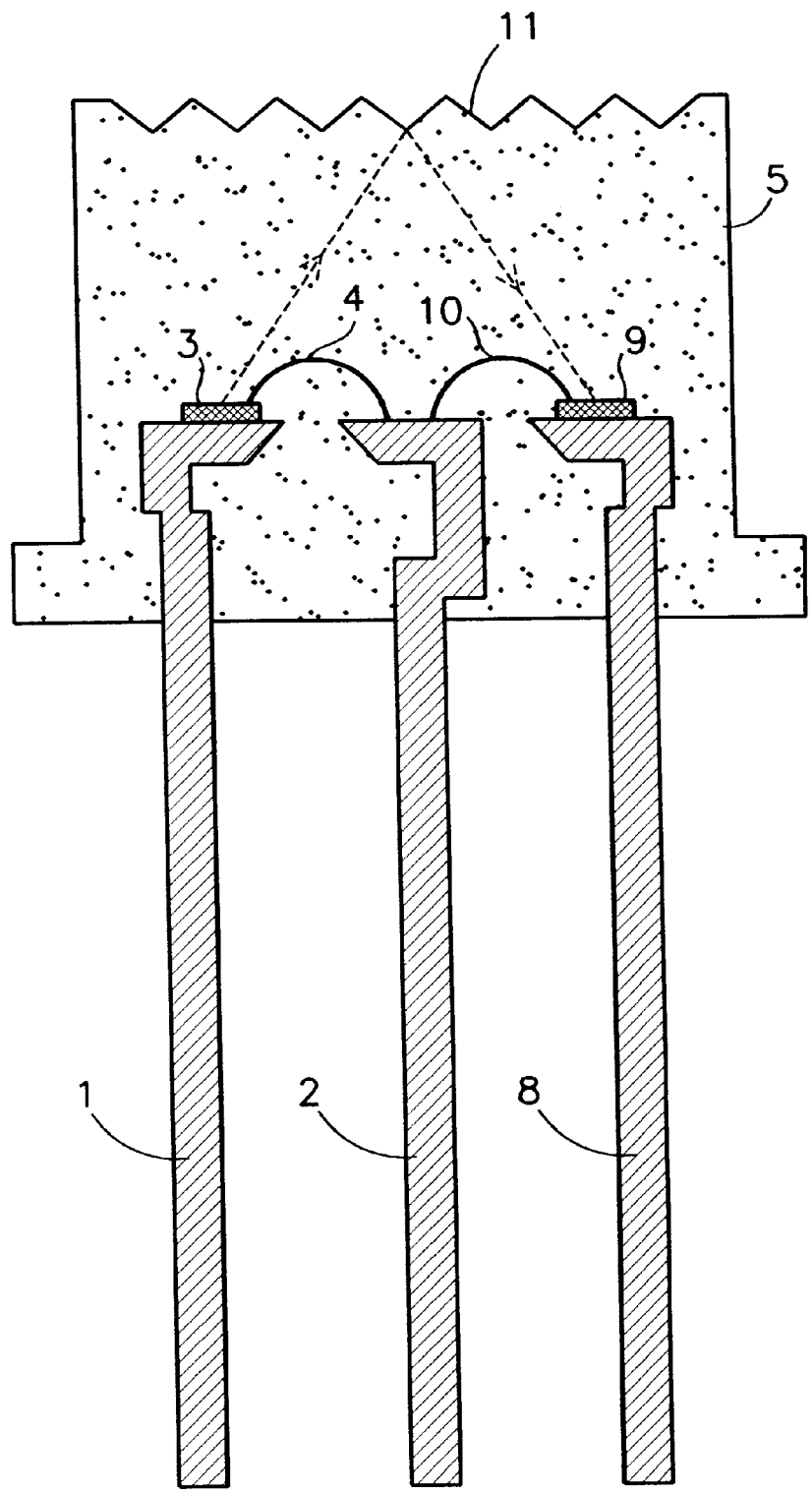
FIG. 4 is another alternative of the conformation shown in FIG. 1.

The package structure shown in FIG. 4, as compared with that shown in FIG. 1, further comprises: a lead frame 8 which is approximately parallel to the lead frames 1 and 2; a light detector 9 disposed above front portion of the lead frame 8 and connected to front portion of the lead frame 2 via a bonding wire 10; a grating 11 formed immediately under top of the emitting laser diode 3, then automatic power control can be performed according to the reflected light received by the light detector 9.

Figure 5:
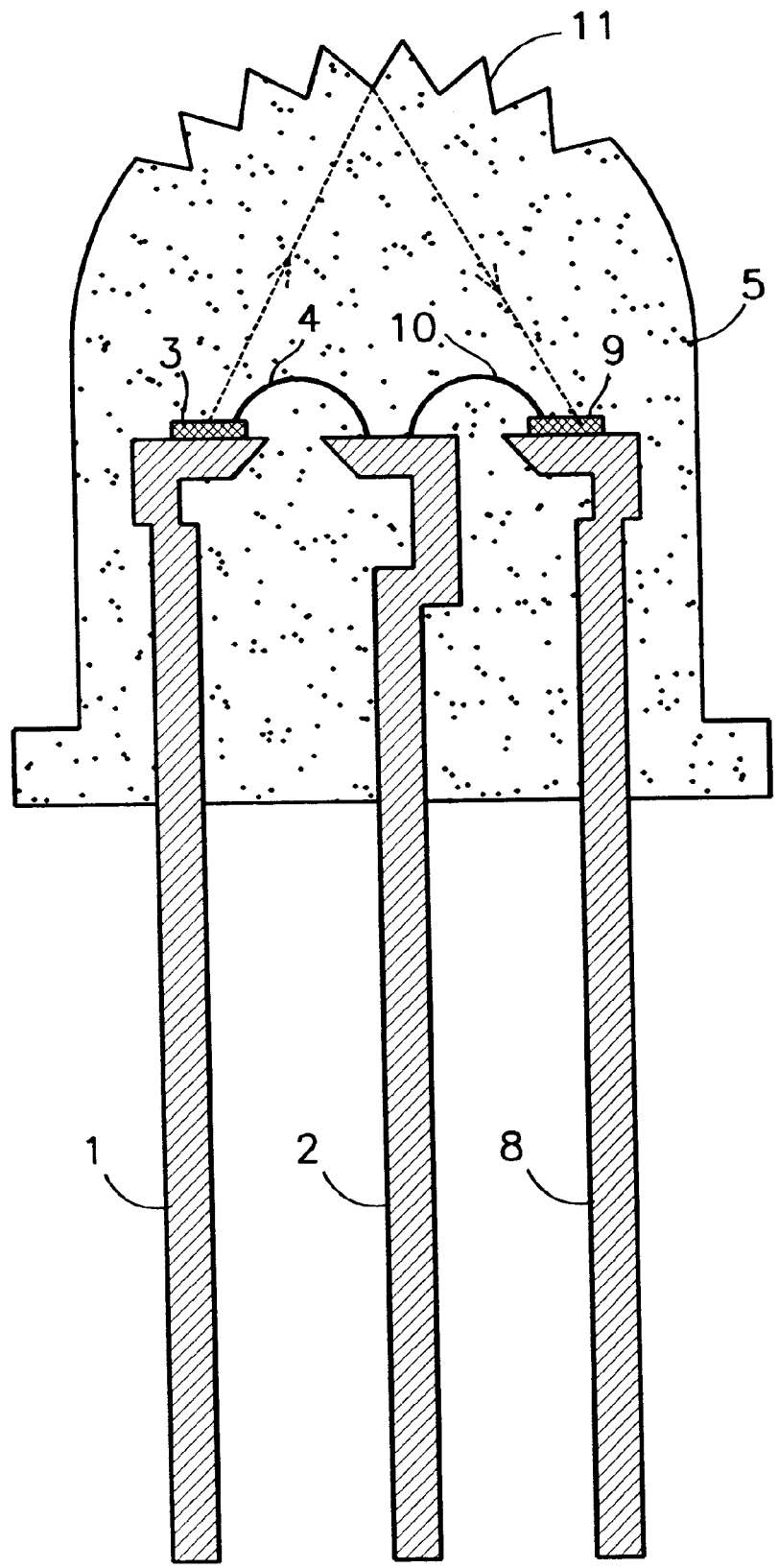
FIG. 5 is an alternative of the conformation shown in FIG. 2.

The structure shown in FIG. 5 is similar to that of FIG. 4, therefore description of its detailed structure is omitted here.

Figure 6:
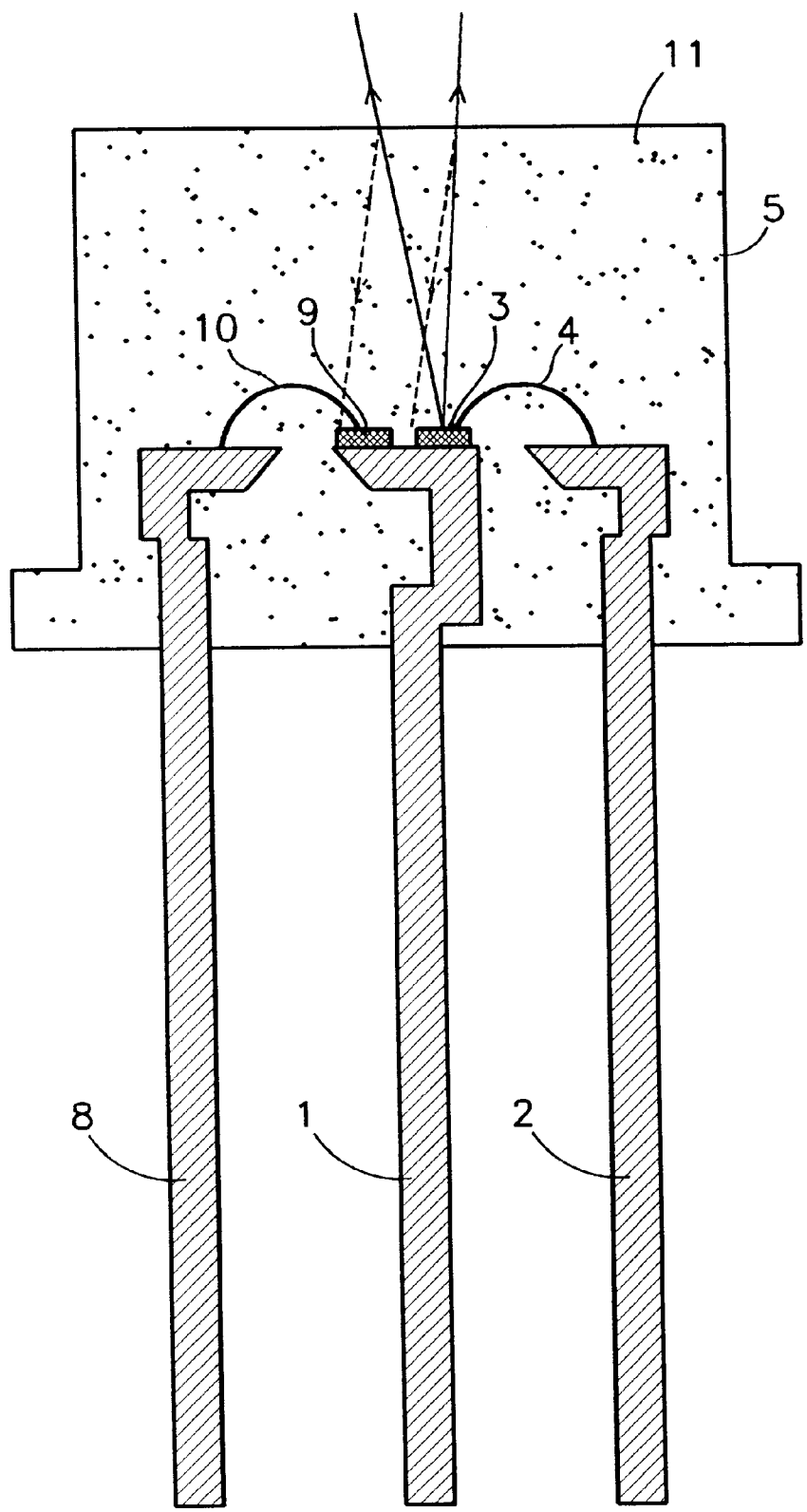
FIG. 6 is yet another alternative of the conformation shown in FIG. 1.

The package structure shown in FIG. 6, as compared with that shown in FIG. 1, further comprises: a lead frame 8 which is approximately parallel to the lead frames 1 and 2; a light detector 9 disposed above the front portion of the lead frame 1 and connected to front portion of the lead frame 8 via a bonding wire 10. Similarly, automatic power control can be performed according to the reflected light received by the light detector 9.

Figure 7:
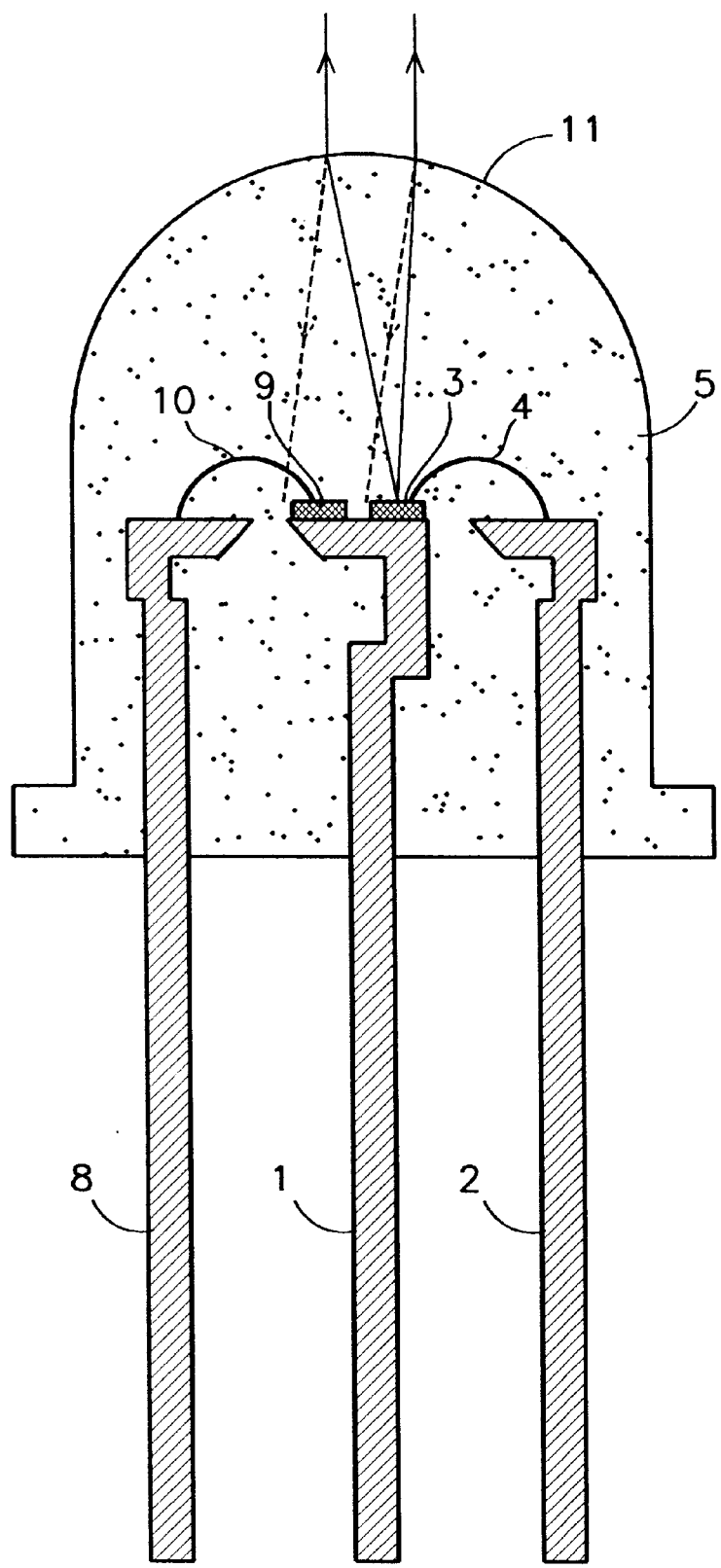
FIG. 7 is an alternative of the conformation shown in FIG. 2.

The structure shown in FIG. 7 is similar to that of FIG. 6, therefore description of its detailed structure is omitted here.

Figure 8:
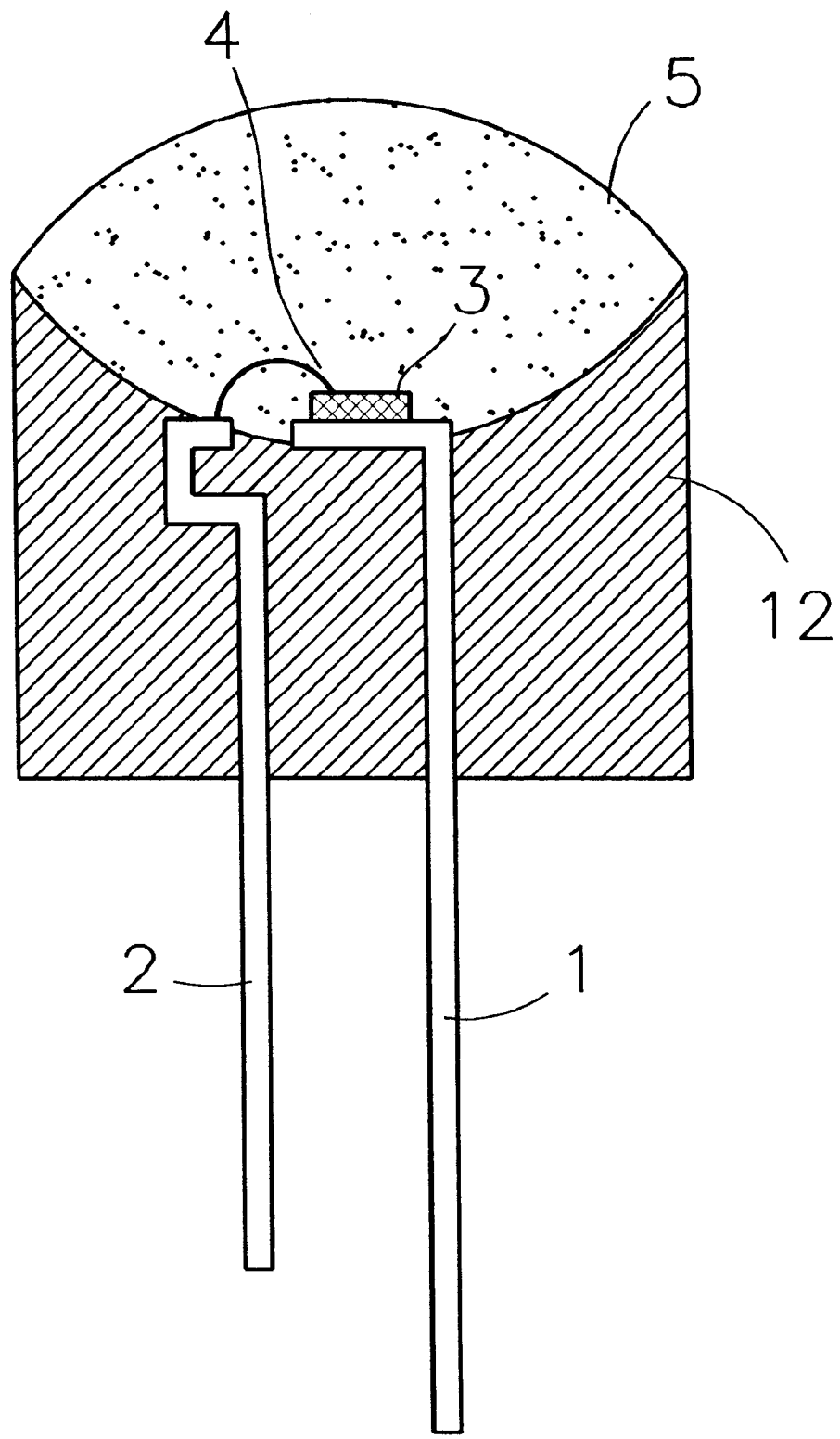
FIG. 8 shows the second preferred embodiment according to the invention.

Referring to FIG. 8, the package structure comprises: a ceramic base 12 having a concave top surface and a flat bottom surface; the lead frames 1 and 2 penetrating the ceramic base 12 from underneath and extending outwardly above the top surface of the ceramic base 12, the signal is inputted from the lead frame 1 and connected to ground via the lead frame 2, while the two lead frames are approximately parallel to each other; a vertical cavity surface-emitting laser diode 3 disposed above the front portion of the lead frame 1 and connected to the front portion of the lead frame 2 via a bonding wire 4; and the epoxy resin 5 which fills the space around the front portions of the lead frames 1 and 2, the vertical cavity surface-emitting laser diode 3, and the bonding wire 4 for fixing and protecting them from damage.

Figure 9:
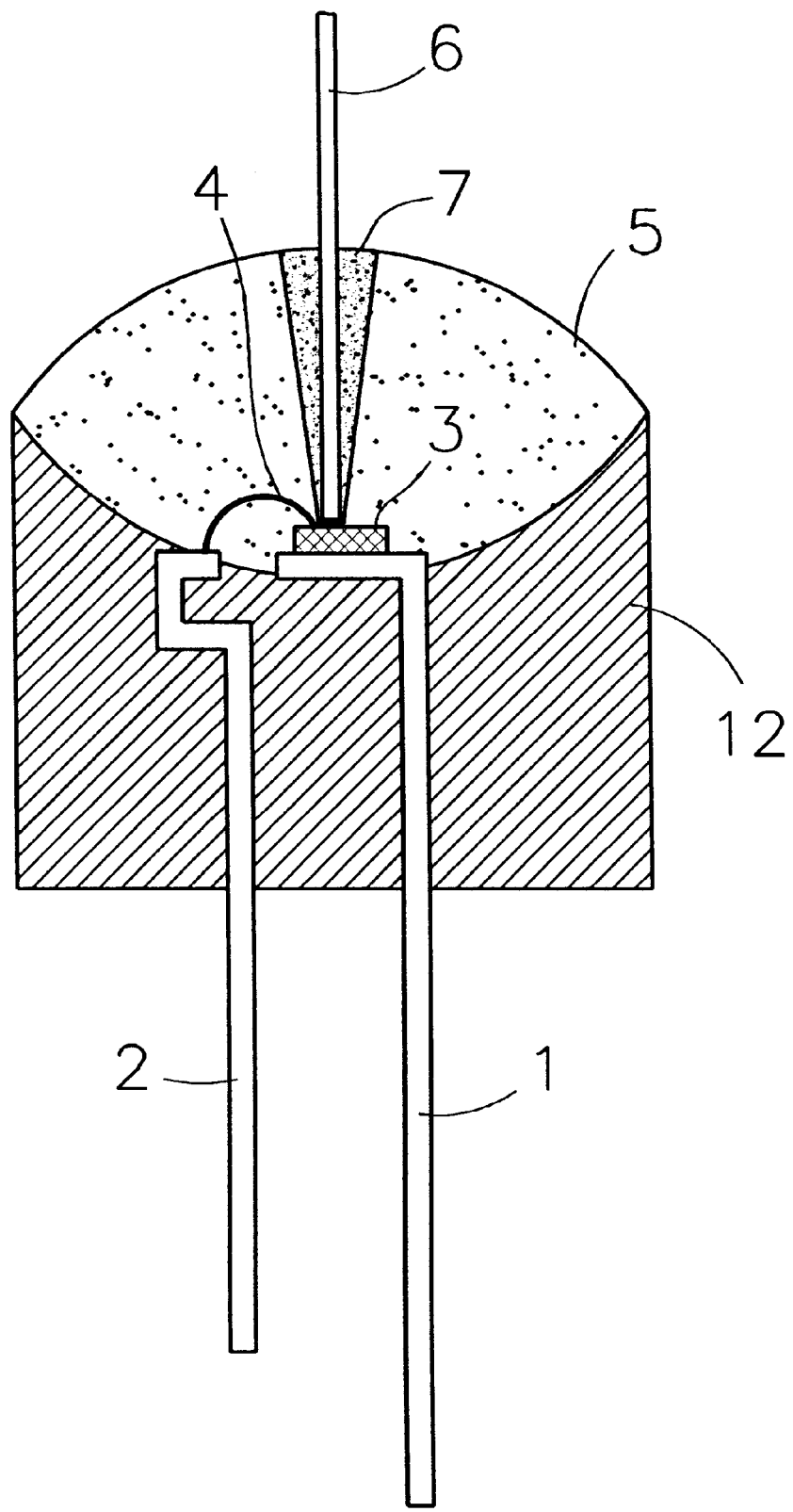
FIG. 9 is an alternative of the preferred embodiment shown in FIG. 8.

The package structure shown in FIG. 9, as compared with that shown in FIG. 8, further comprises an optical fiber 6 protruding into the package structure from outside and connecting to the interior of the package via top very close to the vertical cavity surface-emitting laser diode 3 such that signal can be introduced from the laser diode 3 to outside or from outside to the laser diode 3 through the optical fiber 6. Again, diameter of top end of the crevice on the epoxy resin 5, in which the optical fiber 6 is inserted, is larger than diameter of bottom end of the crevice. The space between said epoxy resin 5 and said optical fiber 6 is filled with another epoxy resin 7 which has a refractive index matching with that of the optical fiber 6.

Comparing the type I embodiment which does not have the ceramic base with the type II embodiment which has a ceramic base, the advantage of type I embodiment is that its structure is simpler, however the type II embodiment has the advantage over the type I embodiment that heat can be dissipated faster because of the large area of the ceramic base (heat can only be dissipated via the lead frames in type I embodiment).

The aforesaid preferred embodiments of the invention are used only for illustrating and not for limiting this invention. Variations and modifications may be made without departing from the spirit and scope of the invention. Therefore, the scope of this invention is intended to cover the following appended claims.

We claim:

1. A vertical cavity surface-emitting laser package which comprises:

a first lead frame and a second lead frame wherein a signal is inputted from said first lead frame and connected to ground through said second lead frame, said two lead frames being approximately parallel to each other;

a vertical cavity surface-emitting laser diode which is disposed above a front portion of said first lead frame and is connected to a front portion of said second lead frame through a bonding wire;

epoxy resin filling a space around the front portions of said first and second lead frames, said vertical cavity surface-emitting laser diode, and said bonding wire for fixing and protecting them from damage;

a third lead frame, which is approximately parallel to said first and second lead frames;

a light detector which is disposed above a front portion of said third lead frame and is connected to the front portion of said second lead frame through a bonding wire;

a grating, disposed immediately under a top surface of said epoxy resin to reflect light emitted from said vertical cavity surface-emitting laser diode, such that automatic power control is thus performed according to the reflected light received by said light detector.

2. A vertical cavity surface-emitting laser package as described in claim 1 wherein said epoxy resin is formed by mold releasing, a shape of said epoxy resin being a cylinder and an axis of said cylinder being approximately parallel to said lead frames.

3. A vertical cavity surface-emitting laser package as described in claim 1 wherein said epoxy resin is formed by mold releasing, a shape of said epoxy resin being a concatenation of two different parts: the first part having a cylindrical shape and the second part having a tapered shape which is similar to a half ellipsoid.

4. A vertical cavity surface-emitting laser package as described in claim 2, and further comprising an optical fiber protruding into the package structure from outside the package and connecting to an interior of the package via a top surface of said epoxy resin, a front end of said optical fiber being disposed very close to said vertical cavity surface-emitting laser diode such that a signal can be introduced from said laser diode to the outside or from the outside to said laser diode.

5. A vertical cavity surface-emitting laser package as described in claim 4 wherein the crevice on said epoxy resin in which said optical fiber is inserted has a larger diameter at a top end, a smaller diameter at a bottom end, and a space between said epoxy resin and said optical fiber is filled with a second epoxy resin which has a refractive index matching that of said optical fiber.

6. A vertical cavity surface-emitting laser package, comprising:

a ceramic base having a concave top surface and a flat bottom surface;

a first lead frame and a second lead frame penetrating said ceramic base from underneath and extending outwardly above the top surface of said ceramic base, a signal being inputted from said first lead frame and connected to ground via said second lead frame, while said two lead frames being approximately parallel to each other;

a vertical cavity surface-emitting laser diode disposed above a front portion of said first lead frame and connected to a front portion of said second lead frame through a bonding wire; and epoxy resin which files a space around the front portions of said first and second lead frames, said vertical cavity surface-emitting laser diode, and said bonding wire for fixing and protecting them from damage.

7. A vertical cavity surface-emitting laser package as described in claim 6 wherein the epoxy resin is packed into said ceramic base by mold releasing.

8. A vertical cavity surface-emitting laser package as described in claim 6, and further comprising an optical fiber protruding into the package structure from outside the package and connecting to an interior of the package via a top surface of said epoxy resin, a front end of said optical fiber being disposed very close to said vertical cavity surface-emitting laser diode such that a signal can be introduced from said laser diode to the outside or from the outside to said laser diode through said optical fiber.

9. A vertical cavity surface-emitting laser package as described in claim 6 wherein a crevice on said epoxy resin in which said optical fiber is inserted has a larger diameter at a top end and a smaller diameter at a bottom end, and a space between said epoxy resin and said optical fiber matches that of said optical fiber.

10. A vertical cavity surface-emitting laser package which comprises:

a first lead frame and a second lead frame wherein a signal is inputted from said first lead frame and connected to ground through said second lead frame, said two lead frames being approximately parallel to each other;

a vertical cavity surface-emitting laser diode which is disposed above a front portion of said first lead frame and is connected to a front portion of said second lead frame through a bonding wire;

epoxy resin filling a space around the front portions of said first and second lead frames, said vertical cavity surface-emitting laser diode, and said bonding wire for fixing and protecting them from damage;

a third lead frame, which is approximately parallel to said first and second lead frames; and a light detector which is disposed above a front portion of said third lead frame and is connected to the front portion of said second lead frame by a bonding wire;

wherein light emitted from said vertical cavity surface-emitting laser diode is reflected and is received by said light detector, such that automatic power control is thus performed according to the reflected light received by said light detector.

11. A vertical cavity surface-emitting laser package as described in claim 10 wherein said epoxy resin is formed by mold releasing a shape of said epoxy resin being a cylinder and an axis of said cylinder being approximately parallel to said lead frames.

12. A vertical cavity surface-emitting laser package as described in claim 10 wherein said epoxy resin is formed by mold releasing, a shape of said epoxy resin being a concatenation of two different parts: the first part having a cylindrical shape and the second part having a tapered shape which is similar to a half ellipsoid.

13. A vertical cavity surface-emitting laser package as described in claim 11, and further comprising an optical fiber protruding into the package structure from outside the package and connecting to an interior of the package via a top surface of said epoxy resin, a front end of said optical fiber being disposed very close to said vertical cavity surface-emitting laser diode such that a signal can be introduced from said laser diode to the outside or from the outside to said laser diode.

14. A vertical cavity surface-emitting laser package as described in claim 13 wherein the crevice on said epoxy resin in which said optical fiber is inserted has a larger diameter at a top end, a smaller diameter at a bottom end, and a space between said epoxy resin and said optical fiber is filled with a second epoxy resin which has a refractive index matching that of said optical fiber.

\* \* \* \* \*